(12) United States Patent
Lee et al.

(10) Patent No.: US 6,252,441 B1
(45) Date of Patent: Jun. 26, 2001

(54) SYNCHRONOUS DATA SAMPLING CIRCUIT

(75) Inventors: Hyong-yong Lee; Sang-chul Kim, both of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/585,443

(22) Filed: Jun. 2, 2000

(30) Foreign Application Priority Data

Jun. 22, 1999 (KR) .................................. 99-23489

(51) Int. Cl.$^7$ ........................................... H03L 7/00
(52) U.S. Cl. ........................... 327/141; 327/144; 326/94
(58) Field of Search ..................... 327/141, 144, 327/145, 154; 326/93, 94

(56) References Cited

U.S. PATENT DOCUMENTS

| 5,532,632 | * | 7/1996 | Kent | 327/141 |
| 5,598,113 | * | 1/1997 | Jex et al. | 326/94 |
| 5,834,950 | * | 11/1998 | Co et al. | 327/12 |

OTHER PUBLICATIONS

ISSCC 96, Session 23, pp378–379 (Feb. 10, 1996).

* cited by examiner

*Primary Examiner*—Kenneth B. Wells
*Assistant Examiner*—Paul Dinh
(74) *Attorney, Agent, or Firm*—Jones Volentine, P.L.L.C.

(57) ABSTRACT

A synchronous data sampling circuit and method are provided by which it is possible to sample four data items during one cycle of a clock signal. In the synchronous data sampling circuit a first pulse signal generator receives the clock signal and generates a first pulse signal during a logic "low" interval of the clock signal. A second pulse signal generator receives the clock signal and generates a second pulse signal during a logic "high" interval of the clock signal. A first sampling unit samples first data input through the input port and outputs the sampled first data to the output port in response to the falling edge of the clock signal. A second sampling unit samples second data input through the input port and outputs the sampled second data to the output port in response to a rising or falling edge of the first pulse signal. A third sampling unit samples third data input through the input port and outputs the sampled third data to the output port in response to the rising edge of the clock signal. A fourth sampling unit samples fourth data input through the input port and outputs the sampled fourth data to the output port in response to the rising or falling edge of the second pulse signal. As a result, four data items are sampled during one cycle of the clock signal, doubling the data sampling efficiency, as compared to the data sampling efficiency of a conventional dual data rate (DDR) method.

19 Claims, 3 Drawing Sheets

SYNCHRONOUS DATA SAMPLING CIRCUIT

This application relies for priority upon Korean Patent Application No. 99-23489, filed on Jun. 22, 1999, the contents of which are herein incorporated by reference in their entirety.

BACKGROUND OF THE INVENTION

The present invention relates to a semiconductor memory device. More particularly, the present invention relates to a data sampling circuit.

Synchronous DRAMs, which operates in synchronization with a system clock signal, have been developed for the high speed operation of semiconductor memory devices. Also, dual data rate (DDR) synchronous DRAMs and Rambus DRAMs, to which data is input and from which data is output in synchronization with the rising and falling edges of a clock signal, have recently been developed to satisfy demands for higher operation frequency.

FIG. 1 is a circuit diagram of a data sampling circuit using a conventional DDR method. FIG. 2 is a timing diagram of the data sampling circuit using the DDR method, shown in FIG. 1.

Referring to FIGS. 1 and 2, in the data sampling circuit of the conventional DDR method, a flip-flop 11 samples data Data1 input through an input and output pad $D_Q$ and outputs the sampled data to a data input and output line $D_{IO}$ at the falling edge of a clock signal CLOCK, i.e., where the level of the clock signal CLOCK is transited from a logic "high" level to a logic "low" level. Also, a flip-flop 13 samples data Data2 input through the input and output pad $D_Q$ and outputs the sampled data to the data input and output line $D_{IO}$ at the rising edge of the clock signal CLOCK, i.e., where the level of the clock signal CLOCK transits from the logic "low" level to the logic "high" level.

Therefore, according to the data sampling scheme of the conventional DDR method, it is possible to sample only two data items during one cycle ($t_{CYCLE}$) of the clock signal (CLOCK).

SUMMARY OF THE INVENTION

To solve the above problem, it is an object of the present invention to provide a synchronous data sampling circuit by which it is possible to sample four data items during one cycle of a clock signal in order to increase data sampling efficiency.

It is another object of the present invention to provide a synchronous data sampling method by which it is possible to sample four data items during one cycle of a clock signal in order to increase data sampling efficiency.

Accordingly, to achieve the first object, there is provided a synchronous data sampling circuit comprising first and second pulse signal generators and first through fourth sampling means.

The first pulse signal generator receives a clock signal and generates a first pulse signal during a logic "low" interval of the clock signal. The second pulse signal generator receives the clock signal and generates a second pulse signal during a logic "high" interval of the clock signal.

The first sampling unit samples first data input through the input port and outputs the sampled first data to the output port in response to the falling edge of the clock signal. The second sampling unit samples second data input through the input port and outputs the sampled second data to the output port in response to an edge of the first pulse signal. The third sampling unit samples third data input through the input port and outputs the sampled third data to the output port in response to the rising edge of the clock signal. The fourth sampling unit samples fourth data input through the input port and outputs the sampled fourth data to the output port, in response to the edge of the second pulse signal.

Preferably, the input nodes of the first through fourth sampling means are commonly connected to an input port to which data items are input and the output nodes of the first through fourth sampling means are commonly connected to an output port.

The edge of the first pulse signal may be either a rising edge or a falling edge. Similarly, the edge of the second pulse signal may be either a rising edge or a falling edge.

The first pulse signal generator may comprise a non-inverting delay for delaying the clock signal; a inverting delay for inverting and delaying the clock signal, the inverting delay having a second delay time that is shorter than a first delay time of the non-inverting delay; and an AND gate for performing an AND operation on the output signal of the non-inverting delay and the output signal of the inverting delay and outputting a result of the AND operation as the first pulse signal.

The second pulse signal generator may comprise a non-inverting delay for delaying the clock signal; an inverting delay for inverting and delaying the clock signal, the inverting delay having a second delay time that is shorter than a first delay time of the non-inverting delay; and an OR gate for performing an OR operation on the output signal of the non-inverting delay and the output signal of the inverting delay and outputting a result of the OR operation as the second pulse signal.

The first through fourth sampling means preferably comprise first through fourth flip-flops.

The first pulse generator may comprise a non-inverting delay for delaying the clock signal; an inverting delay for inverting and delaying the clock signal, the inverting delay having a second delay time that is shorter than a first delay time of the non-inverting delay; and a NAND gate for performing a NAND operation on the output signal of the non-inverting delay and the output signal of the inverting delay, and outputting a result of the NAND operation as the first pulse signal.

The second pulse signal generator may comprise a non-inverting delay for delaying the clock signal; an inverting delay for inverting and delaying the clock signal, the inverting delay having a second delay time that is shorter than a first delay time of the non-inverting delay; and a NOR gate for performing a NOR operation on the output signal of the non-inverting delay and the output signal of the inverting delay, and outputting a result of the NOR operation as the second pulse signal.

To achieve the second object, there is provided a synchronous data sampling method, comprising receiving a clock signal and generating a first pulse signal during a logic "low" interval of the clock signal; receiving the clock signal and generating a second pulse signal during a logic "high" interval of the clock signal; sampling first data input through the input port and outputting the sampled first data to the output port, in response to the falling edge of the clock signal; sampling second data input through the input port and outputting the sampled second data to the output port, in response to an edge of the first pulse signal; sampling third data input through the input port and outputting the sampled third data to the output port, in response to the rising edge of the clock signal; and sampling fourth data input through the input port and outputting the sampled fourth data to the output port, in response to an edge of the second pulse signal.

The edge of the first pulse signal may be either a rising edge or a falling edge. Similarly, the edge of the second pulse signal may be either a rising edge or a falling edge.

The generating of the first pulse signal may comprise delaying the clock signal for a first time period to produce a first signal; inverting the clock signal and delaying the inverted clock signal for a second time period shorter than the first time period, to produce a second signal; and performing an AND operation on the first and second signals to generate the first pulse signal.

The generating of the second pulse signal may comprise delaying the clock signal for a first time period to produce a first signal; inverting the clock signal and delaying the inverted clock signal for a second time period shorter than the first time period, to produce a second signal; and performing an OR operation on a the first and second signals to generate the second pulse signal.

The generating of the first pulse signal may comprise delaying the clock signal for a first time period to produce a first signal; inverting the clock signal and delaying the inverted clock signal for a second time period shorter than the first time period, to produce a second signal; performing an AND operation on the first and second signals to obtain a third signal; and inverting the third signal to generate the first pulse signal.

The generating of the second pulse signal may comprise delaying the clock signal for a first time period to produce a first signal; inverting the clock signal and delaying the inverted clock signal for a second time period shorter than the first time period, to produce a second signal; performing an OR operation on the first and second signals to produce a third signal; and inverting the third signal to generate the second pulse signal.

According to the synchronous data sampling circuit and method of the present invention, data items are sampled at the falling edge of the clock signal, the edge of the first pulse signal, which is generated during a logic "low" interval of the clock signal, the rising edge of the clock signal, and the edge of the second pulse signal, which is generated during a logic "high" interval of the clock signal. In other words, four data items are sampled during one cycle of the clock signal. Therefore, the data sampling efficiency is doubled compared with the data sampling efficiency of a conventional dual data rate (DDR) method.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
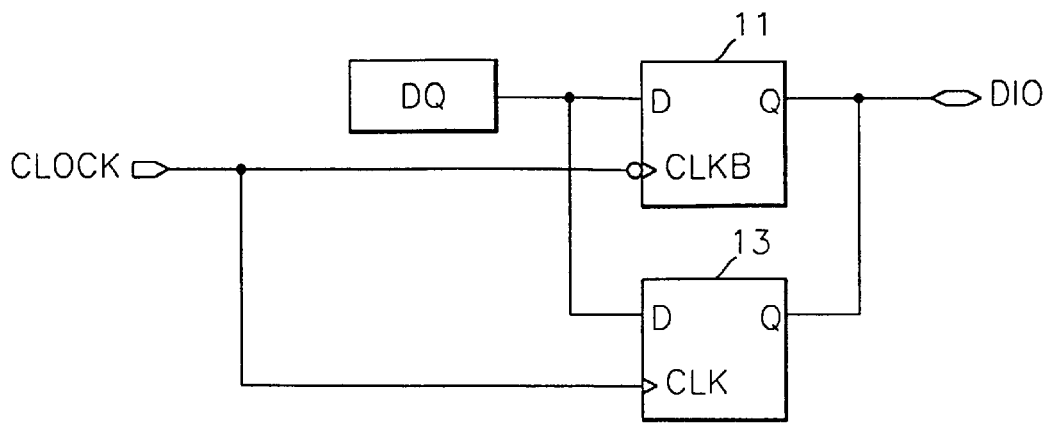
FIG. 1 is a circuit diagram of a data sampling circuit of a conventional dual data rate (DDR) method.
Figure 2:
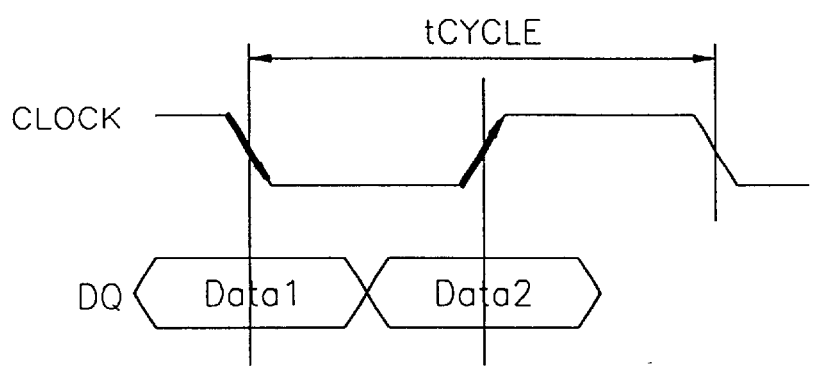
FIG. 2 is a timing diagram of the operation of the data sampling circuit of the conventional DDR method, shown in FIG. 1.

The present invention now will be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. The same reference numerals in different drawings represent the same elements, and thus their description will not be repeated.

Figure 3:
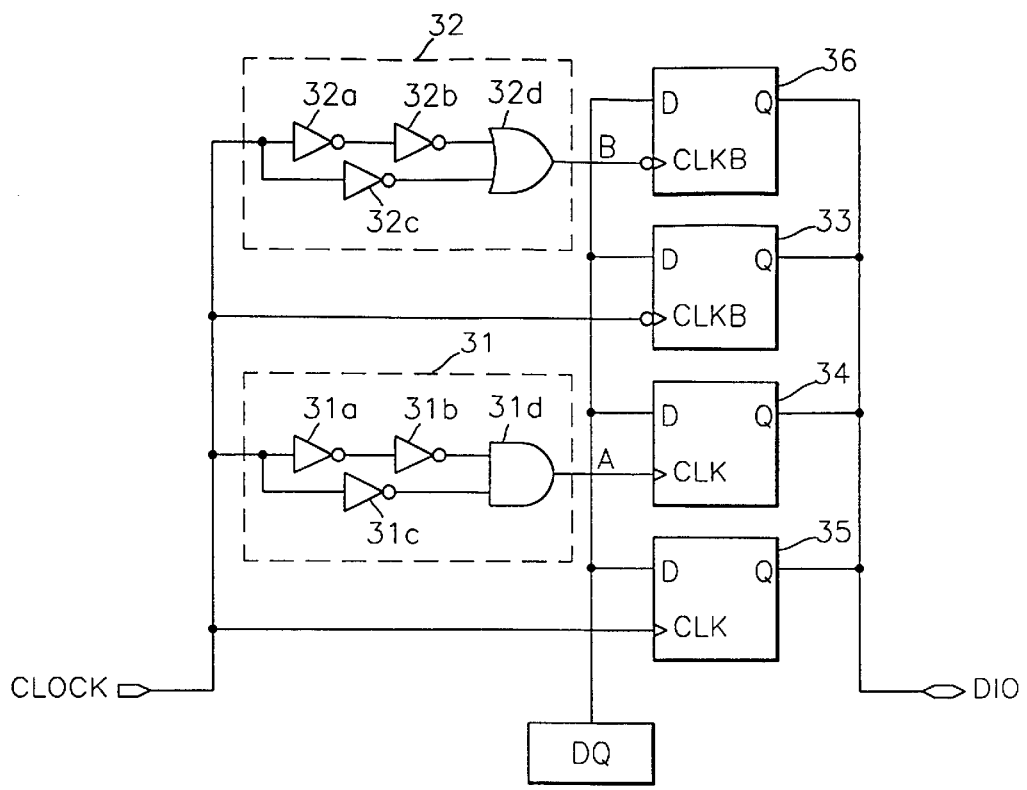
FIG. 3 is a circuit diagram of a synchronous data sampling circuit according to a first preferred embodiment of the present invention.

Referring to FIG. 3, a synchronous data sampling circuit according to a first preferred embodiment of the present invention includes first and second pulse signal generators 31 and 32, and first through fourth sampling units 33, 34, 35, and 36. The synchronous data sampling circuit according to the first preferred embodiment operates by a data sampling method according to the present invention.

The first and second pulse signal generators 31 and 32 each receive a clock signal CLOCK and respectively generate a pulse signal during intervals of different logic levels of the clock signal CLOCK. In particular, as shown in the timing diagram of FIG. 4, the first pulse signal generator 31 receives the clock signal CLOCK and generates a first pulse signal A of a logic "high" level during a logic "low" interval of the clock signal CLOCK. The second pulse signal generator 32 receives the clock signal CLOCK and generates a second pulse signal B of the logic "low" level during the logic "high" interval of the clock signal CLOCK. The clock signal CLOCK is preferably a system clock signal received from outside of a semiconductor device or is a signal generated internally in the semiconductor device.

The first pulse signal generator 31 preferably includes a first non-inverting delay having an two serially connected invertors 31a and 31b, a first inverting delay having a single invertor 31c, and an AND gate 31d. The second pulse signal generator 32 preferably includes a second non-inverting delay having two serially connected invertors 32a and 32b, a second inverting delay having an invertor 32c, and an OR gate 32d. The delay time of the inverting delay is preferably shorter than the delay time of the delay.

In alternate embodiments, the first and second non-inverting delays may have additional inverters, so long as the total number of inverters is even. Similarly, the first and second inverting delays may have additional inverters, so long as the total number of inverters is odd. It will be apparent to those skilled in the art that the first and second pulse signal generators 31 and 32 may also include various other logic gates.

The first and fourth sampling units 33 and 36 are preferably comprised of flip-flops triggered at the negative edge of a received clock signal. The second and third sampling units 34 and 35 are preferably comprised of flip-flops triggered at the positive edge of the received clock signal. The input nodes D of the first through fourth sampling units 33, 34, 35, and 36 are commonly connected to an input port $D_Q$ to which data is input. The output nodes Q of the first through fourth sampling units 33, 34, 35, and 36 are commonly connected to an output port $D_{IO}$. When the synchronous data sampling circuit according to the first preferred embodiment is used as the input circuit of the semiconductor device, the input and output pad of the semiconductor device corresponds to the input port $D_Q$ and a data bus inside the semiconductor device corresponds to the output port $D_{IO}$.

Figure 4:
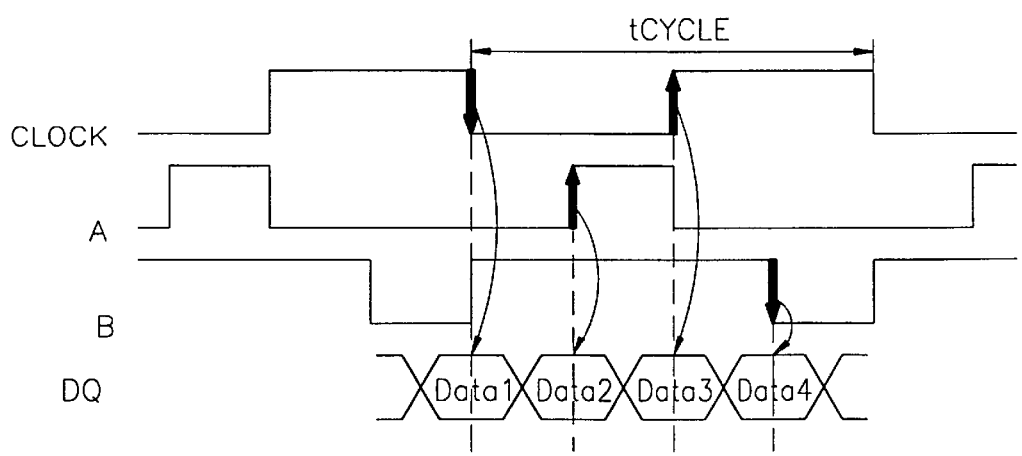
FIG. 4 is a timing diagram of the operation of the synchronous data sampling circuit according to the first preferred embodiment of the present invention, shown in FIG. 3.

Referring to FIGS. 3 and 4, the first sampling unit 33 samples first data Data1 input through the input port $D_Q$ and outputs the sampled first data Data1 to the output port $D_{IO}$ in response to the falling edge of the clock signal CLOCK, i.e., at the point where the level of the clock signal CLOCK is transited from logic "high" level to logic "low" level.

The second sampling unit 34 samples second data Data2 input through the input port $D_Q$ and outputs the sampled second data Data2 to the output port $D_{IO}$, in response to the rising edge of the first pulse signal A, i.e., where the level of the first pulse signal A is transited from logic "low" level to logic "high" level.

The third sampling unit 35 samples third data Data3 input through the input port $D_Q$ and outputs the sampled third data Data3 to the output port $D_{IO}$ in response to the rising edge of the clock signal CLOCK.

The fourth sampling unit 36 samples fourth data Data4 input through the input port $D_Q$ and outputs the sampled fourth data Data4 to the output port $D_{IO}$ in response to the falling edge of the second pulse signal B, i.e., where the level of the second pulse signal B is transited from logic "high" level to logic "low" level.

In the synchronous data sampling circuit according to the first preferred embodiment of the present invention, data items are sequentially sampled at the falling edge of the clock signal CLOCK, the rising edge of the first pulse signal A generated during the logic "low" interval of the clock signal CLOCK, the rising edge of the clock signal CLOCK, and the falling edge of the second pulse signal B generated during the logic "high" interval of the clock signal CLOCK. As a result, four data items are sampled during one cycle $t_{CYCLE}$ of the clock signal CLOCK.

Figure 5:
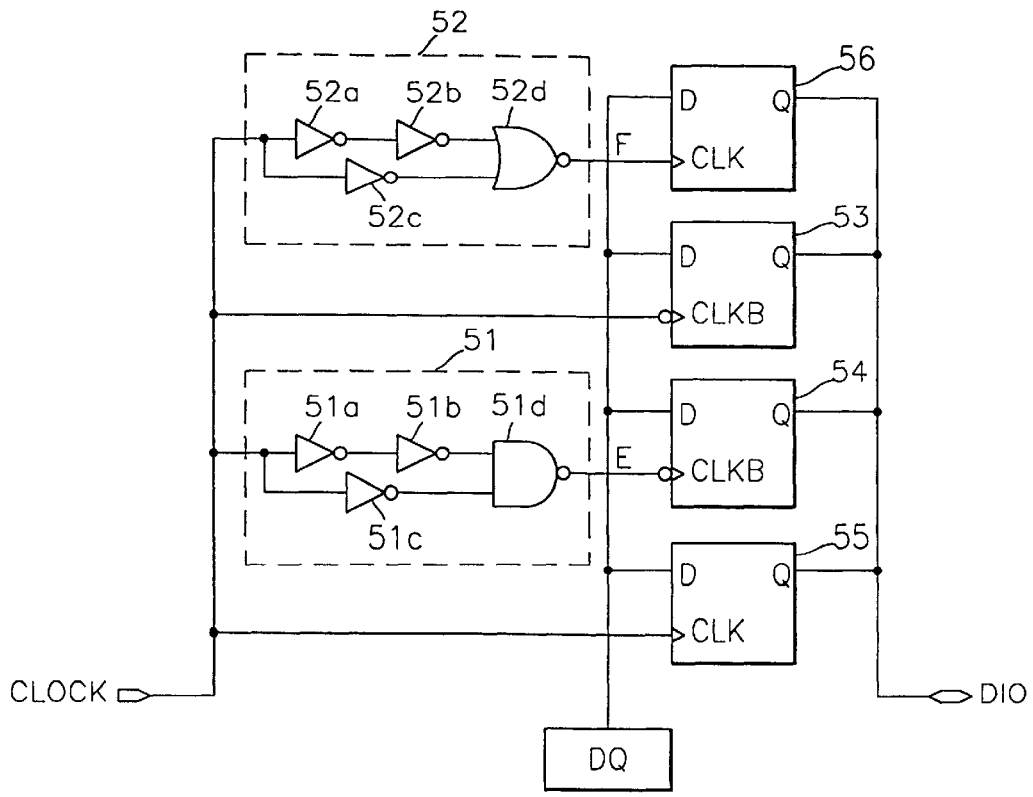
FIG. 5 is a circuit diagram of a synchronous data sampling circuit according to a second preferred embodiment of the present invention.
Figure 6:
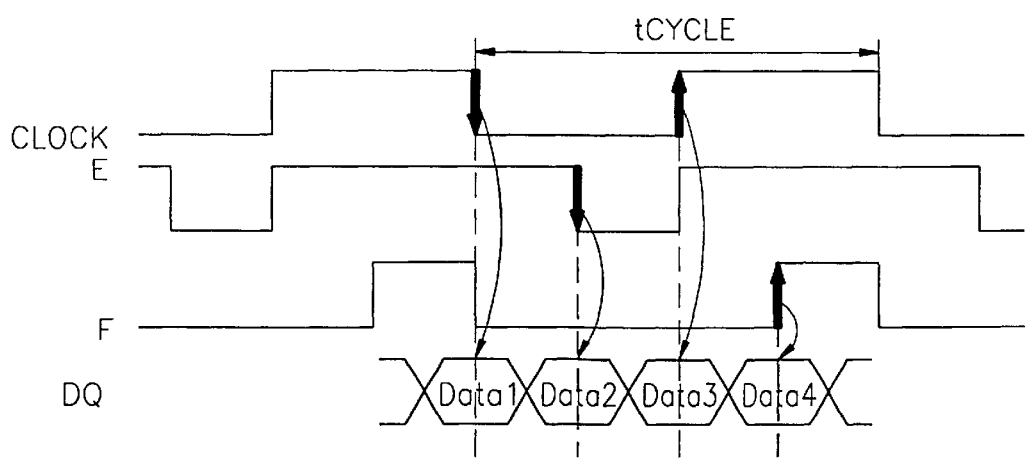
FIG. 6 is a timing diagram of the operation of the synchronous data sampling circuit according to the second preferred embodiment of the present invention, shown in FIG. 5.

FIG. 5 is a circuit diagram of a synchronous data sampling circuit according to a second preferred embodiment of the present invention. FIG. 6 is a timing diagram of the operation of the synchronous data sampling circuit according to the second preferred embodiment of the present invention, shown in FIG. 5. The data sampling circuit according to the second preferred embodiment operates by the data sampling method according to the present invention.

Referring to FIG. 5, the synchronous data sampling circuit according to the second preferred embodiment of the present invention includes first and second pulse signal generators 51 and 52 and first through fourth sampling units 53, 54, 55, and 56.

As shown in the timing diagram of FIG. 6, the first pulse signal generator 51 receives the clock signal CLOCK and generates a first pulse signal E of logic "low" level during logic "low" interval of the clock signal CLOCK. The second pulse signal generator 52 receives the clock signal CLOCK and generates a second pulse signal F of logic "high" level during the logic "high" interval of the clock signal CLOCK. In other words, the first pulse signal generator 51 and the second pulse signal generator 52 generate output signals with phases opposite to the phases of the output signals of the first pulse signal generator 31 and the second pulse signal generator 32, respectively, in the first preferred embodiment of FIG. 3.

The first pulse signal generator 51 preferably includes a first non-inverting delay having two serially connected invertors 51a and 51b, a first inverting delay having a single invertor 51c, and a NAND gate 51d. The second pulse signal generator 52 preferably includes a second non-inverting delay having two serially connected invertors 52a and 52b, a second inverting delay having a single invertor 52c, and a NOR gate 52d. The delay time of the inverting delay is preferably shorter than the delay time of the delay.

In alternate embodiments, the first and second non-inverting delays may have additional inverters, so long as the total number of inverters is even. Similarly, the first and second inverting delays may have additional inverters, so long as the total number of inverters is odd. It will be apparent to those skilled in the art that the first and second pulse signal generators 51 and 52 may include various other logic gates.

The first and second sampling units 53 and 54 are preferably comprised of flip-flops triggered at the negative edge of the received clock signal. The third and fourth sampling units 55 and 56 are preferably comprised of flip-flops triggered at the positive edge of the received clock signal. The input nodes D of the first through fourth sampling units 53, 54, 55, and 56 are commonly connected to the input port $D_Q$ to which data is input. The output nodes Q of the first through fourth sampling units 53, 54, 55, and 56 are commonly connected to the output port $D_{IO}$.

Referring to FIGS. 5 and 6, as in the first preferred embodiment, the first sampling unit 53 samples the first data Data1 input through the input port $D_Q$ and outputs the sampled first data Data1 to the output port $D_{IO}$ in response to the falling edge of the clock signal CLOCK. The third sampling unit 55 samples the third data Data3 input through the input port $D_Q$ and outputs the sampled third data Data3 to the output port $D_{IO}$ in response to the rising edge of the clock signal CLOCK. The second sampling unit 54 samples the second data Data2 input through the input port $D_Q$ and outputs the sampled second data Data2 to the output port $D_{IO}$ in response to the falling edge of the first pulse signal E. The fourth sampling unit 56 samples the fourth data Data4 input through the input port $D_Q$ and outputs the sampled fourth data Data4 to the output port $D_{IO}$ in response to the rising edge of the second pulse signal F.

Thus, in the synchronous data sampling circuit according to the second preferred embodiment of the present invention, data items are sequentially sampled at the falling edge of the clock signal CLOCK, the falling edge of the first pulse signal E generated during the logic "low" interval of the clock signal CLOCK, the rising edge of the clock signal CLOCK, and the rising edge of the second pulse signal F generated during the logic "high" interval of the clock signal CLOCK. As a result, four data items are sampled during one cycle $t_{CYCLE}$ of the clock signal CLOCK.

According to the synchronous data sampling circuit and method of the present invention, it is possible to sample data at the falling edge of the clock signal CLOCK, the rising edge of the clock signal CLOCK, and either the logic "low" interval or the logic "high" interval of the clock signal CLOCK. Also, the synchronous data sampling circuit and method according to the present invention can be applied to the output circuit of the semiconductor device and various applications for increasing data sampling efficiency.

According to the synchronous data sampling circuit and method of the present invention, since four data items are sampled during one cycle of the clock signal, the data sampling efficiency is doubled, compared with the data sampling efficiency of the data sampling scheme of a conventional dual data rate (DDR) method.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A synchronous data sampling circuit for sampling data items sequentially input through an input port and outputting the sampled data items to an output port, the synchronous data sampling circuit comprising:

a first pulse signal generator for receiving a clock signal and generating a first pulse signal during a logic "low" interval of the clock signal;

a second pulse signal generator for receiving the clock signal and generating a second pulse signal during a logic "high" interval of the clock signal;

first sampling unit for sampling first data input through the input port and outputting the sampled first data to the output port in response to the falling edge of the clock signal;

second sampling unit for sampling second data input through the input port and outputting the sampled second data to the output port in response to an edge of the first pulse signal;

third sampling unit for sampling third data input through the input port and outputting the sampled third data to the output port in response to the rising edge of the clock signal; and fourth sampling unit for sampling fourth data input through the input port and outputting the sampled fourth data to the output port, in response to the edge of the second pulse signal.

2. The synchronous data sampling circuit of claim 1, wherein the edge of the first pulse signal is a rising edge.

3. The synchronous data sampling circuit of claim 1, wherein the edge of the first pulse signal is a falling edge.

4. The synchronous data sampling circuit of claim 1, wherein the edge of the second pulse signal is a rising edge.

5. The synchronous data sampling circuit of claim 1, wherein the edge of the second pulse signal is a falling edge.

6. The synchronous data sampling circuit of claim 1, wherein the first pulse signal generator comprises:

a non-inverting delay for delaying the clock signal;

a inverting delay for inverting and delaying the clock signal, the inverting delay having a second delay time that is shorter than a first delay time of the non-inverting delay; and an AND gate for performing an AND operation on the output signal of the non-inverting delay and the output signal of the inverting delay and outputting a result of the AND operation as the first pulse signal.

7. The synchronous data sampling circuit of claim 1, wherein the second pulse signal generator comprises:

a non-inverting delay for delaying the clock signal;

an inverting delay for inverting and delaying the clock signal, the inverting delay having a second delay time that is shorter than a first delay time of the non-inverting delay; and an OR gate for performing an OR operation on the output signal of the non-inverting delay and the output signal of the inverting delay and outputting a result of the OR operation as the second pulse signal.

8. The synchronous data sampling circuit of claim 1, wherein the first through fourth sampling means comprise first through fourth flip-flops.

9. The synchronous data sampling circuit of claim 1, wherein the first pulse signal generator comprises:

a non-inverting delay for delaying the clock signal;

an inverting delay for inverting and delaying the clock signal, the inverting delay having a second delay time that is shorter than a first delay time of the non-inverting delay; and a NAND gate for performing a NAND operation on the output signal of the non-inverting delay and the output signal of the inverting delay, and outputting a result of the NAND operation as the first pulse signal.

10. The synchronous data sampling circuit of claim 1, wherein the second pulse signal generator comprises:

a non-inverting delay for delaying the clock signal;

an inverting delay for inverting and delaying the clock signal, the inverting delay having a second delay time that is shorter than a first delay time of the non-inverting delay; and a NOR gate for performing a NOR operation on the output signal of the non-inverting delay and the output signal of the inverting delay, and outputting a result of the NOR operation as the second pulse signal.

11. A synchronous data sampling method for sampling data items sequentially input through an input port and outputting the sampled data items to an output port, comprising:

receiving a clock signal and generating a first pulse signal during a logic "low" interval of the clock signal;

receiving the clock signal and generating a second pulse signal during a logic "high" interval of the clock signal;

sampling first data input through the input port and outputting the sampled first data to the output port, in response to the falling edge of the clock signal;

sampling second data input through the input port and outputting the sampled second data to the output port, in response to an edge of the first pulse signal;

sampling third data input through the input port and outputting the sampled third data to the output port, in response to the rising edge of the clock signal; and sampling fourth data input through the input port and outputting the sampled fourth data to the output port, in response to an edge of the second pulse signal.

12. The synchronous data sampling method of claim 11, wherein the edge of the first pulse signal is a rising edge.

13. The synchronous data sampling method of claim 11, wherein the edge of the first pulse signal is a falling edge.

14. The synchronous data sampling method of claim 11, wherein the edge of the second pulse signal is a rising edge.

15. The synchronous data sampling method of claim 11, wherein the edge of the second pulse signal is a falling edge.

16. The synchronous data sampling method of claim 11, wherein the generating of the first pulse signal comprises:

delaying the clock signal for a first time period to produce a first signal;

inverting the clock signal and delaying the inverted clock signal for a second time period shorter than the first time period, to produce a second signal; and performing an AND operation on the first and second signals to generate the first pulse signal.

17. The synchronous data sampling method of claim 11, wherein the generating of the second pulse signal comprises:
  delaying the clock signal for a first time period to produce a first signal;
  inverting the clock signal and delaying the inverted clock signal for a second time period shorter than the first time period, to produce a second signal; and
  performing an OR operation on a the first and second signals to generate the second pulse signal.

18. The synchronous data sampling method of claim 11, wherein the generating of the first pulse signal comprises:
  delaying the clock signal for a first time period to produce a first signal;
  inverting the clock signal and delaying the inverted clock signal for a second time period shorter than the first time period, to produce a second signal;
  performing an AND operation on the first and second signals to obtain a third signal; and
  inverting the third signal to generate the first pulse signal.

19. The synchronous data sampling method of claim 11, wherein the generating of the second pulse signal comprises:
  delaying the clock signal for a first time period to produce a first signal;
  inverting the clock signal and delaying the inverted clock signal for a second time period shorter than the first time period, to produce a second signal;
  performing an OR operation on the first and second signals to produce a third signal; and
  inverting the third signal to generate the second pulse signal.

* * * * *